(12) United States Patent
Faulkner (10) Patent No.: US 10,152,563 B2
(45) Date of Patent: Dec. 11, 2018

(54) SYSTEM AND METHOD FOR DESIGNING ACCESSIBLE AND USABLE SPACES HAVING BUILT-IN FURNISHINGS IN A MULTI-UNIT ENVIRONMENT

(76) Inventor: Adrienne A. Faulkner, Dallas, TX (US)

(*) Notice: Subject to any disclaimer, the term of this patent is extended or adjusted under 35 U.S.C. 154(b) by 406 days.

(21) Appl. No.: 13/554,943

(22) Filed: Jul. 20, 2012

(65) Prior Publication Data
US 2013/0024797 A1     Jan. 24, 2013

Related U.S. Application Data
(60) Provisional application No. 61/509,631, filed on Jul. 20, 2011.

(51) Int. Cl.
*G06F 17/50* (2006.01)

(52) U.S. Cl.
CPC ................ *G06F 17/5004* (2013.01)

(58) Field of Classification Search
CPC ............... G06F 17/50; G06F 17/5004
USPC ........................................ 703/1, 2
See application file for complete search history.

(56) References Cited

U.S. PATENT DOCUMENTS

| | | | |
|---|---|---|---|
| 5,950,206 A | 9/1999 | Krause | |
| 6,295,513 B1* | 9/2001 | Thackston | 703/1 |
| 6,581,040 B1 | 6/2003 | Wright et al. | |
| 7,418,666 B2* | 8/2008 | Cortesi et al. | 715/765 |
| 7,469,242 B2* | 12/2008 | Tompras et al. | |
| 7,685,013 B2 | 3/2010 | Gendler | |
| 7,756,816 B2 | 7/2010 | Scott | |
| 7,797,210 B2 | 9/2010 | Eichorn et al. | |
| 7,848,183 B2 | 12/2010 | Sasaki | |
| 8,589,128 B2* | 11/2013 | Buchowski | G06F 17/50 700/182 |
| 2004/0128755 A1* | 7/2004 | Loberger | E03C 1/14 4/642 |
| 2004/0139400 A1 | 7/2004 | Allam et al. | |
| 2008/0189166 A1* | 8/2008 | Brooks | 705/10 |
| 2011/0197351 A1* | 8/2011 | Cook | A47K 3/40 4/604 |

OTHER PUBLICATIONS

Han et al. (Compliance Analysis for Disabled Access, 2003 (12 pages)).*
International Search Report, PCT/US2012/47740, dated Oct. 17, 2012.

* cited by examiner

*Primary Examiner* — Andre Pierre Louis
(74) *Attorney, Agent, or Firm* — Scott T. Griggs; Griggs Bergen LLP (57) ABSTRACT

Systems and methods for designing accessible and usable spaces having built-in elements in multi-unit environments are disclosed. In one embodiment of the system for designing accessible spaces, the system includes a library storing multiple pre-designed universal built-in elements. Each of the pre-designed universal built-in elements includes structural data indicative of clear floor space compliance, reach range compliance, and operable parts compliance. Also, the structural data is indicative of anthropometric data compliance for non-physically challenged and physically challenged persons. A design engine configured to communicate with a user interface provides for design choices by a user and the generation of plan drawings.

14 Claims, 6 Drawing Sheets

SYSTEM AND METHOD FOR DESIGNING ACCESSIBLE AND USABLE SPACES HAVING BUILT-IN FURNISHINGS IN A MULTI-UNIT ENVIRONMENT

PRIORITY STATEMENT & CROSS-REFERENCE TO RELATED APPLICATIONS

This application claims priority from U.S. Patent Application No. 61/509,631, entitled "System and Method for Designing Accessible and Usable Spaces Having Built-in Furnishings in a Multi-unit Environment" and filed on Jul. 20, 2011, in the name of Adrienne Faulkner; which is hereby incorporated by reference for all purposes.

TECHNICAL FIELD OF THE INVENTION

This invention relates, in general, to design and, in particular, to a system and method for designing accessible and usable spaces having built-in elements in a multi-unit environment using computer-based systems and methods.

BACKGROUND OF THE INVENTION

Various accessibility and usable standards detail the reach and the technical requirements that sites and buildings have to meet to provide ease of use by individuals with mental and physical disabilities and/or challenges. More specifically, the concept involves the creation of facilities that comply with the design, construction and modification regulations without infringing on the use of the space for non-disabled individuals. There is a need for well designed accessible and usable spaces which are efficient and cost-effective.

SUMMARY OF THE INVENTION

It would be advantageous to achieve better design for accessible and usable spaces that provide ease of use by individuals with mental and physical disabilities and/or challenges, without infringing use by non-disabled persons, thereby allowing a single designed space to be marketed and used by both non-physically challenged and physically challenged, to include those that may be temporarily challenged. It would also be desirable to enable a computer-based solution that would be both efficient and cost effective. To better address one or more of these concerns, in one aspect of the invention, systems and methods for designing accessible and usable spaces having built-in elements are disclosed.

In one embodiment of the system for designing accessible spaces, the system includes a library storing multiple pre-designed universal built-in elements. Each of the pre-designed universal built-in elements includes structural data indicative of clear floor space compliance, reach range compliance, and operable parts compliance. Also, the structural data is indicative of anthropometric data compliance for non-disabled (non-physically challenged) and disabled (physically challenged) persons, including those that may be temporarily challenged. A design engine configured to communicate with a user interface provides for design choices by a user and the generation of plan drawings or other applicable drawing format and/or CAD, REVIT, or other file formats, as appropriate.

In one implementation, each of the pre-designed universal built-in elements satisfies at least three design criteria including non-physically challenged design criteria, physically challenged design criteria, and aesthetic design criteria. Other design criteria may also be satisfied, including materials design criteria, financing time design criteria, availability design criteria, manufacturing design criteria, and throughput design criteria. Not only may various criteria be integrated, but various entities may be consulted in a collaborative fashion as the project unfolds, including developers, contractors, designers, manufacturers, and architects. The entities may also include financial market participants, such as lenders and insurers. These and other aspects of the invention will be apparent from and elucidated with reference to the embodiments described hereinafter.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the present invention.

Figure 1:
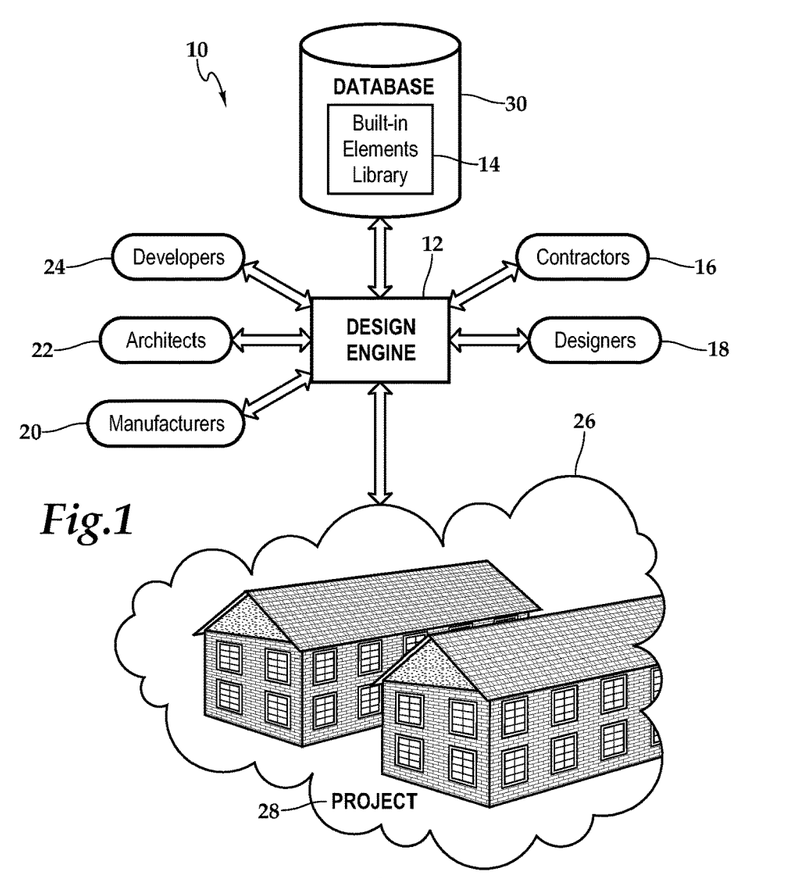
FIG. 1 is a schematic block diagram of one embodiment of a system for designing accessible and usable spaces having built-in elements according to the teachings presented herein.

Referring initially to FIG. 1, therein is depicted a system 10 for designing accessible and usable spaces having built-in elements that is schematically illustrated. The system 10 includes a centralized design engine 12, which may be embodied on a processor or server or one or more computers, for example. As shown, the design engine 12 is located in communication with a library 14, contractors 16, designers 18, manufacturers 20, architects 22, and developers 24, which are interfacing to design a multi-unit environment 26 at project 28. The entities involved may also include financial market participants, such as lenders and insurers. The library 14, which may be embodied on a database 30, may include multiple universal built-in elements, which will be discussed in further detail hereinbelow. The designers 18, manufacturers 20, architects 22 and others may interact with the design engine 12 to design the project 28 and make the project 28 an accessible and usable space having built-in elements and to collaborate on the design of universal built-in elements.

Figure 2:
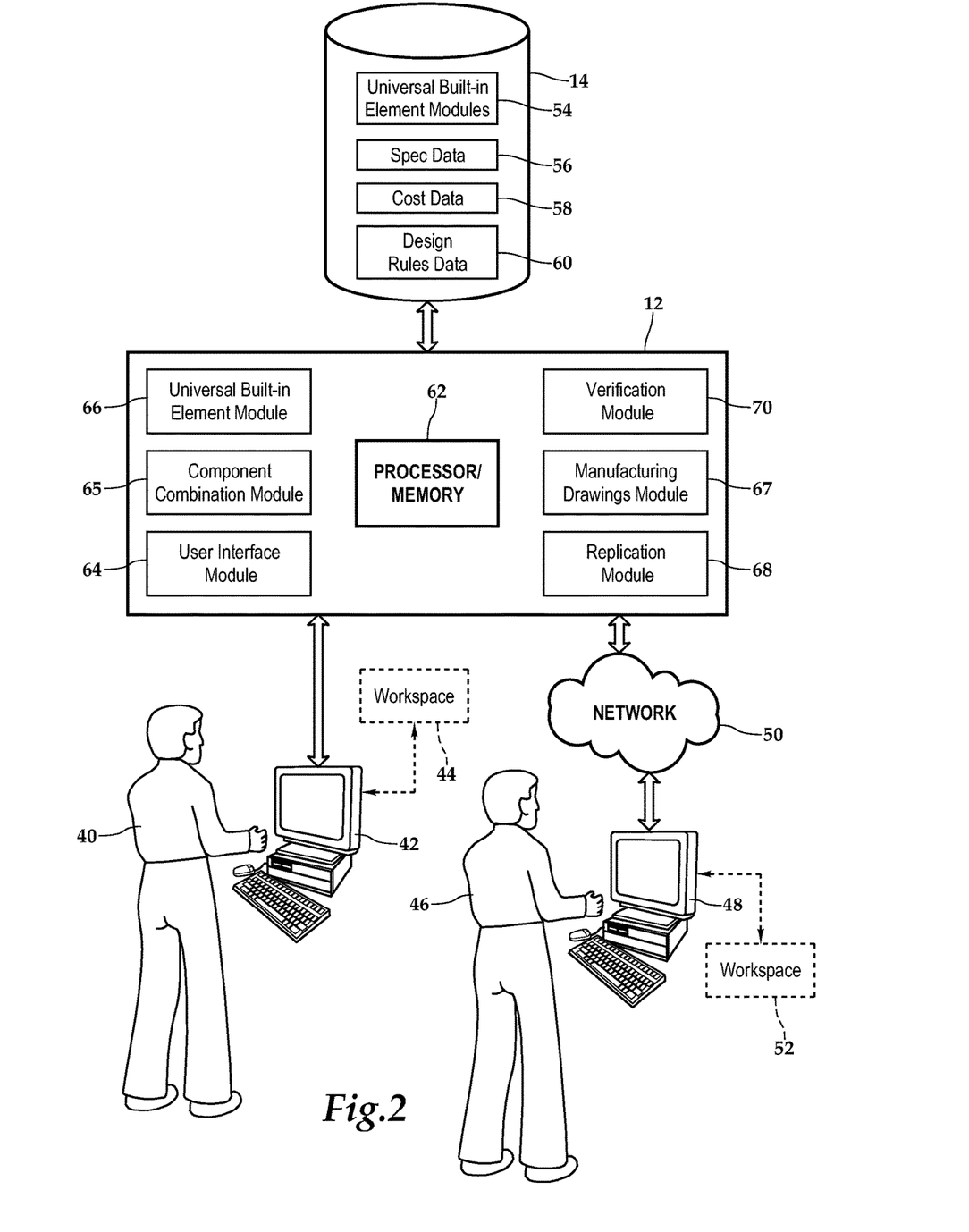
FIG. 2 is a schematic block diagram of a computer-centered implementation of the system shown in FIG. 1.

Referring to FIG. 2, the interaction between the design engine 12 and the library 14 is shown in further detail, wherein a user 40, who may be a designer, manufacturer, or architect, for example, is accessing the design engine via a computer 42, having a workspace 44. Similarly, a user 46 is accessing the design engine 12 via a computer 48 and a network 50, such as the Internet. Workspace 52 supports the user 46.

The library 14 includes universal built-in element models 54, specification data 56, cost data 58, and design rules data 60. The specification data 56 includes dimensional data of the built-in elements, such as height, width, and length. The specification data 56 also includes structural data relative to clear floor space compliance, reach range compliance, and operable parts compliance. Structural data 56 indicative of anthropometric data compliance for non-physically challenged and physically challenged persons is also included, to include, in one embodiment, compliance for those that may be temporarily challenged.

The cost data 58 may include information relative to the total cost of construction of particular universal built-in elements and/or data relative to the total cost of ownership of the universal built-in elements. The total cost of ownership may include the cost of construction as well as costs associated with ownership such as maintenance, energy costs, and the like. The design rules 60 data may include compulsory design rules or suggested design rules. The design rules data 60 also include rules for ensuring the compatibility between multiple universal built-in elements.

The design engine 12 is configured to communicate via user interfaces with the users 40, 46. The design engine 12 includes a processor and memory 62 programmed to implement a variety of modules in addition to the user interface module 64 that provides the user interfaces. A universal built-in element search module 66 is configured to receive input criteria associated with design preferences of the designer and to access the library 14 to automatically identify certain ones of the pre-designed universal built-in elements that satisfy the input criteria and various component combinations with the component combination module 65.

A replication module 68 is configured to receive input associated with selected ones of the identified pre-designed universal built-in elements and to load models of each of the selected pre-designed universal built-in elements to a workspace, such as workspace 44 or 52, of the user interface. The replication module 68 may then scale projects from a single unit to multi-unit environments, which may include multi-family dwelling buildings or the multi-family portion of a mixed-use building, for example. A verification module 70 is configured to receive input regarding a desired arrangement of the models within the workspace and determine, based on the embedded information of the selected pre-designed universal built-in elements, if the desired arrangement of the models violates compliance rules.

When the desired arrangement of the models violates at least one of the compliance rules, an alert may be generated to identify the violated compliance rule. On the other hand, when the desired arrangement of the models does not violate the compliance rules or complies with the compliance rules, the models are arranged based on the received input regarding the desired arrangement. The verification module may then scale the project accordingly and produce any required plans and CAD or REVIT files, or other required format, with the manufacturing drawings module 67. It should be appreciated that although FIGS. 1 and 2 illustrate a particular computer and network architecture, that the computer and network architecture deployed may vary with the deployment requirements and specific use. Other computer and network architectures are within the teachings presented herein.

Figures 3A, 3B, 3C:
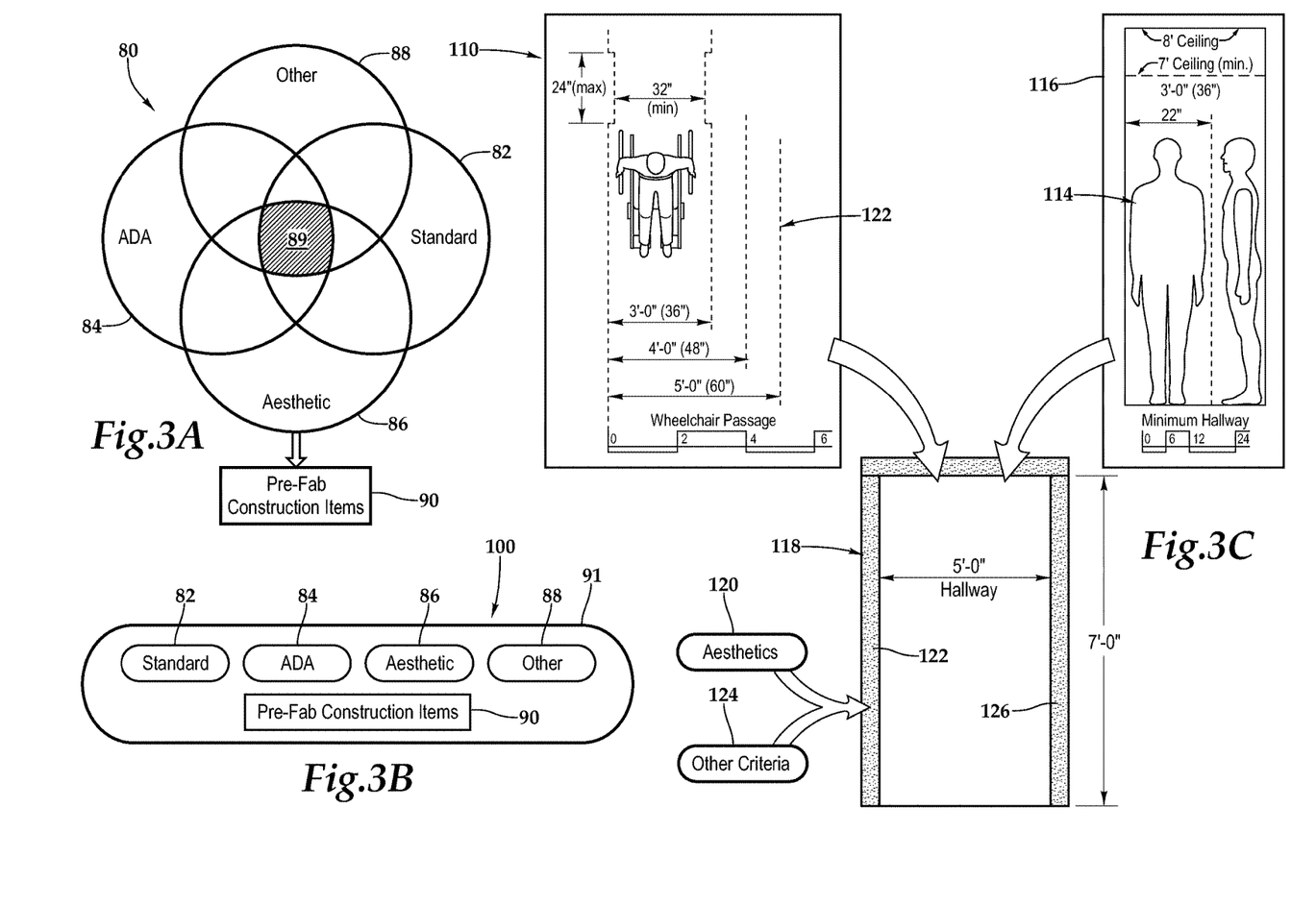
FIG. 3A is a schematic block diagram of one embodiment of design parameters for universal storage components for accessible and usable spaces having built-in elements.
FIG. 3B is a schematic block diagram of another embodiment of design parameters for universal storage components for accessible and usable spaces having built-in elements.
FIG. 3C is a schematic diagram of one implementation of the design parameters for built-in elements.

Referring now to FIG. 3A, a design parameter schematic 80 is depicted for universal built-in elements for accessible and usable spaces having built-in elements. The library 14, which embodies the design parameter schematic 80, includes structural and specification data indicative of clear floor space compliance, reach range compliance, and operable parts compliance for both ADA compliance for physically challenged persons and standard data for non-physically challenged persons, wherein this range of compliance includes those individuals that may be temporarily challenged. As shown, the pre-designed universal built-in elements satisfy at least three design criteria including non-physically challenged design criteria 82, physically challenged design criteria 84, and aesthetic design criteria 86.

Anthropometric data compliance is indicated as universal for non-physically challenged and physically challenged persons, including those with temporary challenges, and each of the pre-designed universal built-in elements further including plan drawings data or other drawings data in the library indicative of the anthropometric data compliance, which is represented in design parameter schematic 80 by the non-physically challenged design criteria 82 and physically challenged design criteria 84. More specifically, the anthropometric data compliance is concerned with clear floor space compliance, reach range compliance, and operable parts compliance. With respect to the clear floor space compliance, non-infringement of proximate floor space by the built-in furnishings is considered. By way of example, clear floor is forty-eight (48) inches minimum in length and thirty-two (32) inches in width for a wheel chair (physically challenged person) and twenty-two (22) inches in width for a non-physically challenged person. Clear floor space compliance also includes non-infringement of an approach by the built-in furnishings for forward/parallel approaches, circular turning spaces, and T-shaped turning spaces.

Clear floor space compliance further comprises knee and toe clearance as well as protrusion limits into the proximate floor space by the built-in furnishings. By way of example, physically challenged individuals, including individuals experiencing a temporary challenge, require objects with leading edges more than thirty-seven (27) inches and not more than eighty (80) inches above the floor to protrude no more than four (4) inches horizontally into a circulation path.

With respect to reach range compliance, built-in furnishings must not infringe, that is, provide forward unobstructed reach ranges, forward obstructed high reach ranges, side unobstructed reach ranges, and side obstructed high reach ranges. Operable parts compliance includes ensuring objects having operability with one hand without a requirement of tight grasping, pinching, and twisting of the wrist.

The aesthetic design criteria 86 involves judgments of aesthetic value that rely on the ability to discriminate at a sensory level, whether sight, sound, touch, etc, and the appropriate aesthetic selection based on the context and intended purpose of the universal built-in element or elements. In many instances, in a multi-unit environment, for example, a unit may be labeled as being exclusively for a non-physically challenged or a physically challenged individual, including a temporarily challenged individual. Such labeling may create a stigma with unit resulting in an inability to occupy the unit, if demand from physically challenged individuals is not present. By designing units that are accessible and usable for all users and applying an aesthetic design criteria that appeals to non-physically challenged and physically challenged individuals, supply may better respond to demand and units are not underutilized. Other design criteria, as indicated by criteria 88, may also be satisfied, including materials design criteria, financing time design criteria, availability design criteria, manufacturing design criteria, and throughput design criteria. Not only may various criteria be integrated, but various entities may be consulted in a collaborative fashion as the project unfolds, including developers, contractors, designers, manufacturers, and architects. Additionally, the entities interacting may also include financial market participants, such as lenders and insurers.

As shown, the combination of design criteria 82-88 are all satisfied by the pre-fab construction items 90, which represents the universal built-in elements. In particular a synergy represented by numeral 89 is achieved by the built-in elements satisfying multiple criteria. Similarly, the design parameter diagram 100 in FIG. 3B illustrates the additive effect or value added of combining the various design criteria 82-88, wherein the resulting pre-fab construction items 90 are a result of the sum being greater than the individual constituent components, as illustrated by numeral 89.

Referring now to FIG. 3C, one implementation of anthropometric data compliance is shown. With respect to a physically challenged person, a wheel chair 110 requires certain special requirements 112, including a horizontal clearance of thirty-six (36) inches for the wheel chair 110, forty-eight (48) inches for the wheel chair and a walking person, and sixty (60) inches for two wheel chairs. Vertical clearance is minimal. With respect to a non-physically challenged person 114, certain spacial requirements 116 include a vertical clearance of seven (7) feet is required and a horizontal clearance of twenty-two (22) inches for one person and thirty-six (36) inches for two non-physically challenged person. Therefore, the designed space 118 is designed to be five (5) feet wide and seven (7) feet tall to have anthropometric data compliance for both physically challenged and non-physically challenged individuals, including individuals that are temporarily challenged. Aesthetic decisions 120, such as form and molding 122, are made such that the space appeals to be physically challenged and non-physically challenged individuals. Additional design criteria 124, including materials design criteria, are utilized to determine the material that should be used based on price and, in this particular example, the selective use of wood 126.

Figure 4:
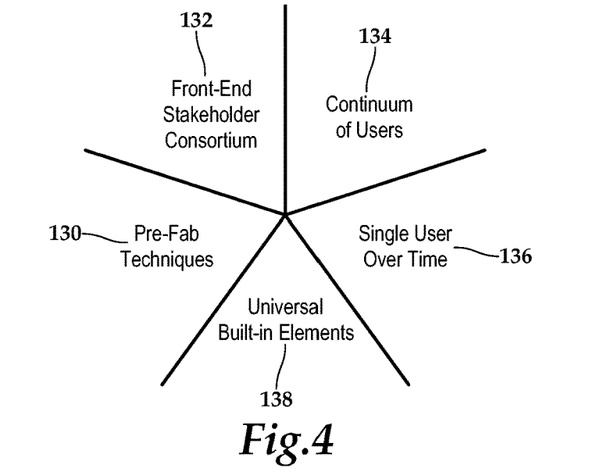
FIG. 4 is a schematic diagram of one embodiment of the service parameters provided by the system shown in FIG. 1.

With the approach presented herein, prefabrication, including the movement toward factory-built construction, is joined with construction that is accessible to all users. This methodology represents more than just a faster way of building. Universal built-in elements, everything from paint colors on the walls to fixtures, may be determined before construction begins and may be determined in a manner that designs and builds spaces for both physically challenged and non-physically challenged end users, as well as the many users that may be physically challenged and physically able to varying degrees. Therefore, a single design, which removes barriers to accessibility, can not only accommodate different users, but a single user that has a change in physical ability over a period of time. With respect to the unit or asset, such an approach repositions the asset and provides more diversity in potential supply, such that a particular asset is designed as a multiple-user asset rather than a single user asset. As shown in FIG. 4, for a single project, the system and method generate, with pre-fabrication techniques 130 and a consortium of stakeholders 132 on the front-end of the project, a pre-fabricated product comprising universal built-in elements 138 that serves a continuum of users 134, as represented by the extremes of a physically challenged user and a non-physically challenged user. Additionally, not only are a continuum of users serve, but a single user 136 over a period of time and a spectrum of physical ability.

In this approach, each of the pre-designed universal built-in elements is designed by the consortium of stakeholders 132 for pre-fabrication techniques and usable by a continuum of users and a single user over a period of time and changing physical capabilities. This methodology brings together the previously discussed developers, architects, manufacturers, contractors, designers, and financial market participants on the front-end in a consortium to design a single unit for all users as well as an individual user, whose physical capabilities may change. In this manner, the design-build process is streamlined and a single style of unit serves the entire market now and in the future. In particular, the universal built-in elements 138 may be existing pre-fabricated elements or elements pre-fabricated specifically for a single project or multiple projects. Once designed, the built-in elements are scalable from unit-to-unit, unit-to-project, and project-to-project.

The universal built-in elements refer to any architectural or mechanical or structure component of a building, facility, space or site. These architectural, mechanical, and structural components are relative to clear floor space compliance (vertical and horizontal), reach range compliance, and operable parts compliance, to include not only spaces but built-in fixtures, such as handles and doors and other objects of interaction, for example. A non-exhaustive and illustrative listing of built-in elements includes the following:

Doors
Doorknobs
Counter top heights
Near-ground lighting
Lighting switches/controls
Thresholds
Positioning of plumbing/water controls
Cabinets
Drawers
Hallway widths
Floor maneuverability space
Sink height
Window actuation Other examples of built-in elements may be found within this application and understood from the definitions of clear floor space compliance, reach range compliance, and operable parts compliance provided herein.

Figure 5:
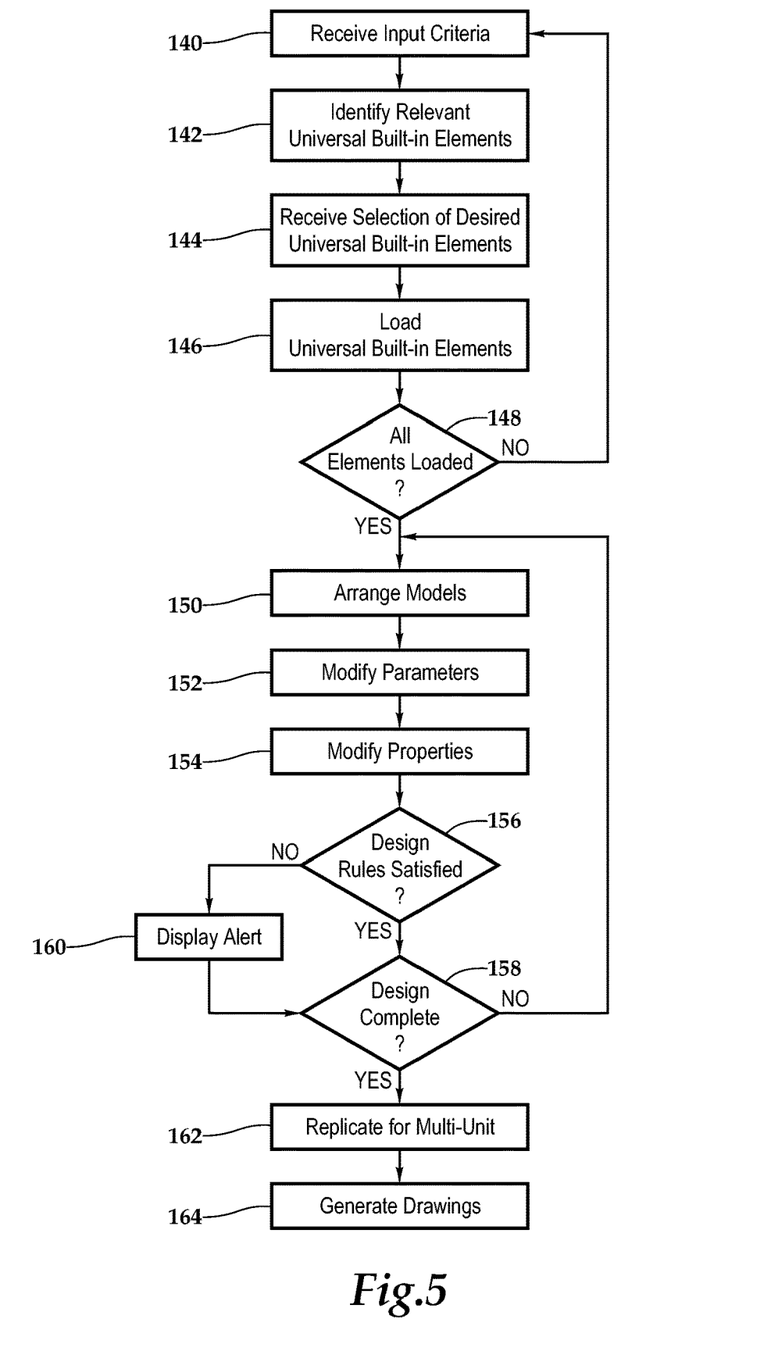
FIG. 5 is a flowchart of one embodiment of a method for designing accessible and usable spaces having built-in elements according to the teachings presented herein.
Figure 6:
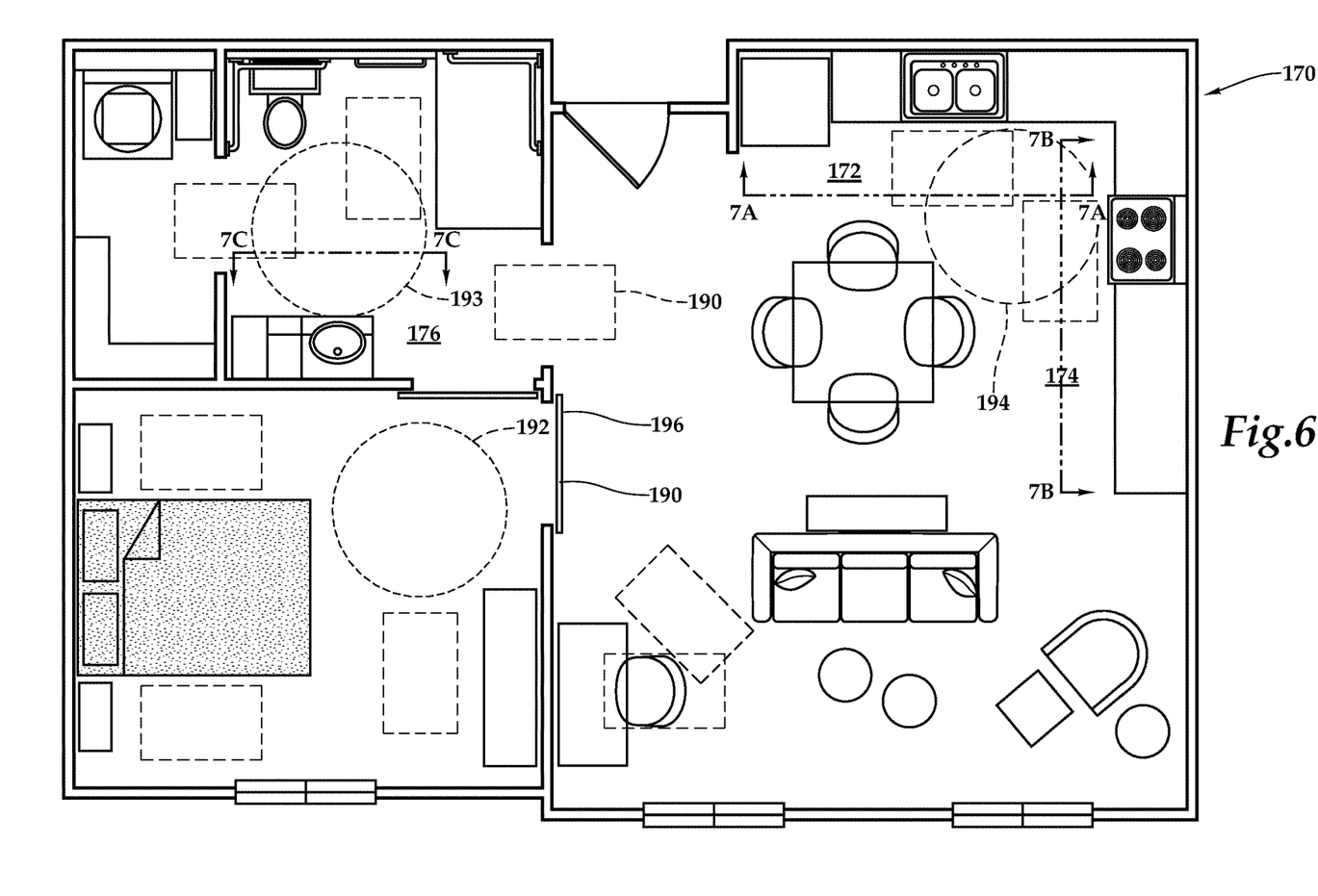
FIG. 6 is a top plan view of an accessible and usable space designed according to the teachings presented herein.
Figure 7A:
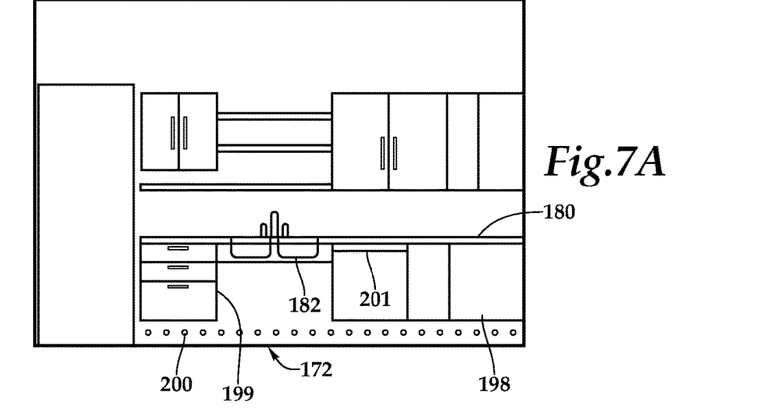
FIG. 7A is a front elevation view of a kitchen along lines 7A-7A in FIG. 6.
Figure 7B:
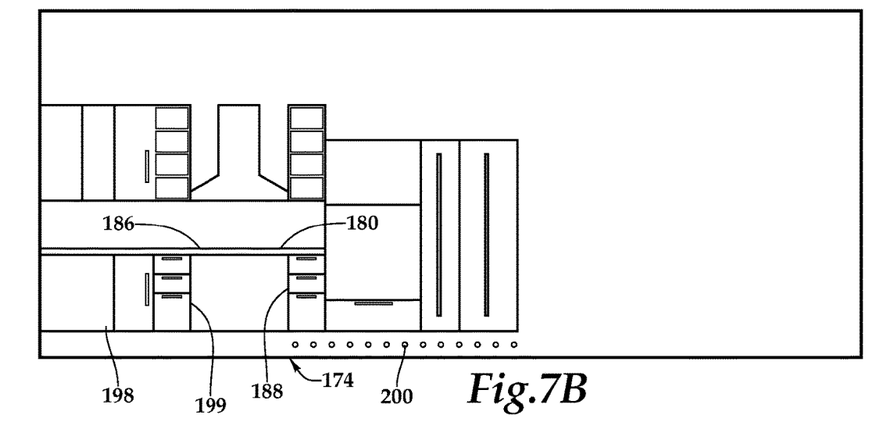
FIG. 7B is a second front elevation view of the kitchen along lines 7B-7B in FIG. 6.
Figure 7C:
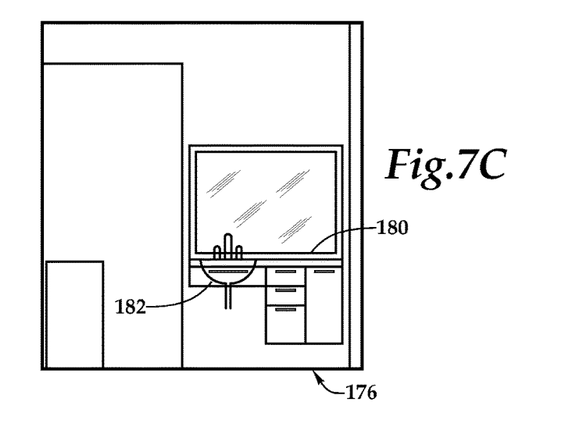
FIG. 7C is a front elevation view of the bathroom along lines 7C-7C in FIG. 6.

Referring now to FIG. 5, one embodiment of a method is disclosed for designing accessible and usable spaces having built-in elements according to the teachings presented herein. At the first block 140, input criteria associated with design preferences of a designer is received at a design engine configured to communicate with a user interface. At the next block 142, at least one library of pre-designed universal built-in elements is accessed to identify relevant storage components. As previously discussed, each of the pre-designed universal built-in elements includes structural data indicative of clear floor space compliance, reach range compliance, and operable parts compliance as well as data relative to anthropometric data compliance for non-physically challenged and physically challenged persons. Plan drawings data or other applicable data is also available in the library, which may be embodied on a storage volume or memory, for example.

At the following blocks 144 and 146, the selection of desired universal built-in elements is made and certain ones of the pre-designed universal built-in elements that satisfy the input criteria provided are automatically identified and loaded. The input criteria may relate to design and functionality, such as the selection of different types of built-in elements and the user's overall design and layout of the space. At a decision block 148, if all of the universal built-in elements are identified and loaded, then the methodology advances to block 150. If not, then the methodology returns to block 140.

At the next blocks 150, 152, 154, once the models of the selected pre-designed universal built-in furnishings have been transmitted to a workspace of the user, further design input is received from the user and various parameters and properties of the space may be modified. At another decision block 156, the methodology determines, based on the embedded information of the selected pre-designed universal storage components, if the desired arrangement of the models fulfills the anthropometric data compliance rules. If the design rules are satisfied, the methodology advances to a further block 158. On the other hand, if the anthropometric data compliance rules are violated, then the methodology advances to another block 160, where an alert is provided.

Returning to the decision block 158, if the design is complete, then the method advances to a different block 162 where the arrangement of models is replicated to create a multi-unit environment wherein non-physically challenged and physically challenged persons may utilize each unit in the multi-unit environment. At the following block 164, drawings may be generated. If, however, the design is not complete at decision block 158, then the method returns to the previously discussed block 150.

Referring now to FIGS. 6 and 7A through 7C, one unit of a multi-unit environment 170, such as a hotel or apartment complex, for example, is depicted wherein universal built-in elements and in particular exemplary and non-limiting built-in elements 180-200 are utilized to provide usability to both physically and non-physically challenged persons. As depicted, this non-limiting example includes a sink area 172, a stove area 174, and a bathroom area 176. Also, as shown, all countertops 180 are thirty-four (34) inches. Sinks 182 have a clearance width of thirty-six (36) inches with removable or open shelves 184 below. Cook-tops 186 are thirty-six (36) inches with open/slide-out shelves below 188. All the door openings 190 are forty-two (42) inches wide or more. All spaces, such as spaces 192, 194, defined by walls and other objects include five (5)-foot turnarounds for wheelchairs. Sliding doors 196 are provided for accessibility for operate parts compliance. For the same reasons, all lower cabinets 198 have drawers or slide-out shelves. Access and clearance openings 199 are present as is another universal built-in element, pull out table 201. For visibility, LED lights 200 are located under cabinets for way finding and safety.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A system for designing accessible and usable spaces having built-in elements in a multi-unit apartment environment, the system comprising:

a library of pre-designed universal built-in elements for the multi-unit apartment environment prior to build of the multi-unit apartment environment, each of the pre-designed universal built-in elements including structural data indicative of clear floor space compliance, reach range compliance, and operable parts compliance, each of the pre-designed universal built-in elements including structural data indicative of anthropometric data compliance for unknown universal non-physically challenged persons and universal unknown physically challenged persons, each of the pre-designed universal built-in elements further including drawing pre-built, non-as-built data, each of the pre-designed universal built-in elements being anthropometric data compliant with both the universal unknown non-physically challenged persons and universal unknown physically challenged persons such that the universal unknown non-physically challenged persons may independently reside in any unit of the multi-unit apartment environment and the universal unknown physically challenged persons may independently reside in any unit of the multi-unit apartment environment; and a design engine designing a unit of the multi-unit apartment environment prior to build of the multi-unit apartment environment, the design engine having a processor and memory accessible to the processor, the processor configured to communicate with a user interface, the memory accessible to the processor, the memory including processor-executable instructions that, when executed, cause the processor to:

receive input criteria associated with design preferences via the user interface, the input criteria relating to design and functionality of the multi-unit apartment environment prior to build of the multi-unit environment, access the library to automatically identify certain ones of the pre-designed universal built-in elements that satisfy the input criteria for the unit of the multi-unit apartment environment prior to build of the multi-unit apartment environment, transmit models of each of the selected pre-designed universal built-in elements to a workspace of the user interface, the models being derived from the drawing pre-built, non-as-built data, the models being for the unit of the multi-apartment environment prior to build of the multi-unit apartment environment, receive input regarding a desired arrangement of the models within the workspace via the user interface, and determine, based on the embedded information of the selected pre-designed universal built-in elements, if the desired arrangement of the models fulfill anthropometric data compliance rules, arrange the models based on the received input regarding the desired arrangement, and replicate the arrangement of models for the unit to create the multi-unit apartment environment wherein actual unknown non-physically challenged and unknown physically challenged persons may utilize each unit in the multi-unit apartment environment after build.

2. The system as recited in claim 1, wherein clear floor space compliance further comprises non-infringement of proximate floor space.

3. The system as recited in claim 1, wherein clear floor space compliance further comprises non-infringement of an approach selected from the group consisting of forward/parallel approach, circular turning space, and T-shaped turning space.

4. The system as recited in claim 1, wherein clear floor space compliance further comprises knee and toe clearance.

5. The system as recited in claim 1, wherein clear floor space compliance further comprises protrusion limits into the proximate floor space.

6. The system as recited in claim 1, wherein reach range compliance further comprises compliance with reach ranges selected from the group consisting of forward unobstructed reach ranges, forward obstructed high reach ranges, side unobstructed reach ranges, and side obstructed high reach ranges.

7. The system as recited in claim 1, wherein operable parts compliance further comprises operability with one hand without a requirement of tight grasping, pinching, and twisting of the wrist.

8. The system as recited in claim 1, wherein anthropometric data compliance for non-physically challenged and physically challenged persons further comprises ergonomic safety and comfort for both non-disabled and disabled persons.

9. A system for designing accessible and usable spaces having built-in elements in a multi-unit apartment environment, the system comprising:

a library of pre-designed universal built-in elements for the multi-unit apartment environment prior to build of the multi-unit apartment environment, each of the pre-designed universal built-in elements including structural data indicative of clear floor space compliance, reach range compliance, and operable parts compliance, each of the pre-designed universal built-in elements including structural data indicative of anthropometric data compliance for universal unknown non-physically challenged persons and universal unknown physically challenged persons, each of the pre-designed universal built-in elements further including drawing pre-built, non-as-built data, each of the pre-designed universal built-in elements being anthropometric data compliant with both the universal unknown non-physically challenged persons and universal unknown physically challenged persons such that the universal unknown non-physically challenged persons may independently reside in any unit of the multi-unit apartment environment and the universal unknown physically challenged persons may independently reside in any unit of the multi-unit apartment environment;

the library existing prior to build of the multi-unit environment;

each of the pre-designed universal built-in elements satisfying at least three design criteria including non-physically challenged design criteria, physically challenged design criteria, and aesthetic design criteria; and a design engine designing a unit of a multi-unit environment prior to build of the multi-unit apartment environment, the design engine having a processor and memory accessible to the processor, the processor configured to communicate with a user interface, the memory accessible to the processor, the memory including processor-executable instructions that, when executed, cause the processor to:

receive input criteria associated with design preferences via the user interface, the input criteria relating to design and functionality of the multi-unit apartment environment prior to build of the multi-unit environment, access the library to automatically identify certain ones of the pre-designed universal built-in elements that satisfy the input criteria for the unit of the multi-unit apartment environment prior to build of the multi-unit apartment environment, transmit models of each of the selected pre-designed universal built-in elements to a workspace of the user interface, the models being derived from the drawing pre-built, non-as-built data, the models being for the unit of the multi-environment prior to build of the multi-unit apartment environment, receive input regarding a desired arrangement of the models within the workspace via the user interface, and determine, based on the embedded information of the selected pre-designed universal built-in elements, if the desired arrangement of the models fulfill anthropometric data compliance rules, arrange the models based on the received input regarding the desired arrangement, and replicate the arrangement of models for the unit to create a multi-unit apartment environment wherein actual unknown non-physically challenged and unknown physically challenged persons may utilize each unit in the multi-unit apartment environment after build.

10. The system as recited in claim 9, wherein each of the pre-designed universal built-in elements satisfies a fourth design criteria selected from the group consisting of materials design criteria, financing time design criteria, availability design criteria, manufacturing design criteria, and throughput design criteria.

11. The system as recited in claim 10, wherein the set of design criteria are selected by at least two entities selected from the group consisting of developers, contractors, designers, manufacturers, architects, and financial market participants.

12. A system for designing accessible and usable spaces having built-in elements in a multi-unit apartment environment, the system comprising:

a library of pre-designed universal built-in elements for the multi-unit apartment environment prior to build of the multi-unit apartment environment, each of the pre-designed universal built-in elements including structural data indicative of clear floor space compliance, reach range compliance, and operable parts compliance, each of the pre-designed universal built-in elements including structural data indicative of anthropometric data compliance for universal unknown non-physically challenged persons and universal unknown physically challenged persons, each of the pre-designed universal built-in elements further including drawing pre-built, non-as-built data, each of the pre-designed universal built-in elements being anthropometric data compliant with both the universal unknown non-physically challenged persons and universal unknown physically challenged persons such that the universal unknown non-physically challenged persons may independently reside in any unit of the multi-unit apartment environment and the universal unknown physically challenged persons may independently reside in any unit of the multi-unit apartment environment;

the library existing prior to build of the multi-unit environment;

each of the pre-designed universal built-in elements satisfying at least three design criteria including non-physically challenged design criteria, physically challenged design criteria, and aesthetic design criteria;

each of the pre-designed universal built-in elements being designed by a consortium of stakeholders for pre-fabrication techniques and usable by a continuum of users and a single user over a period of time and changing physical capabilities;

a physical environment in which the multi-unit apartment environment under design will be built;

a design engine designing a unit of a multi-unit apartment environment prior to build of the multi-unit apartment environment, the design engine having a processor and memory accessible to the processor, the processor configured to communicate with a user interface, the memory accessible to the processor, the memory including processor-executable instructions that, when executed, cause the processor to:

receive input criteria associated with design preferences via the user interface, the input criteria relating to design and functionality of the multi-unit apartment environment prior to build of the multi-unit apartment environment,     access the library to automatically identify certain ones of the pre-designed universal built-in elements that satisfy the input criteria for the unit of the multi-unit apartment environment prior to build of the multi-unit environment,     transmit models of each of the selected pre-designed universal built-in elements to a workspace of the user interface, the models being derived from the drawing pre-built, non-as-built data, the models being for the unit of the multi-environment prior to build of the multi-unit apartment environment,     receive input regarding a desired arrangement of the models within the workspace via the user interface, and     determine, based on the embedded information of the selected pre-designed universal built-in elements,     if the desired arrangement of the models fulfill anthropometric data compliance rules, arrange the models based on the received input regarding the desired arrangement, and replicate the arrangement of models for the unit to create the multi-unit apartment environment wherein actual unknown non-physically challenged and unknown physically challenged persons may utilize each unit in the multi-unit apartment environment after build; and following the design engine designing the unit of a multi-unit environment and replicating the design to create the multi-unit environment, the multi-unit apartment environment.

13. The system as recited in claim 12, wherein each of the pre-designed universal built-in elements satisfies a fourth design criteria selected from the group consisting of materials design criteria, financing time design criteria, availability design criteria, manufacturing design criteria, and throughput design criteria.

14. The system as recited in claim 12, wherein the set of design criteria are selected by at least two entities selected from the group consisting of developers, contractors, designers, manufacturers, architects, and financial market participants.

\* \* \* \* \*